(12) United States Patent
Keshavarzi et al.

(10) Patent No.: US 7,102,358 B2
(45) Date of Patent: Sep. 5, 2006

(54) OVERVOLTAGE DETECTION APPARATUS, METHOD, AND SYSTEM

(75) Inventors: Ali Keshavarzi, Portland, OR (US); Fabrice Paillet, Hillsboro, OR (US); Muhammad M Khellah, Tigard, OR (US); Dinesh Somasekhar, Portland, OR (US); Yibin Ye, Portland, OR (US); Stephen H Tang, Pleasanton, CA (US); Mohsen Alavi, Portland, OR (US); Vivek K De, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/880,337

(22) Filed: Jun. 29, 2004

(65) Prior Publication Data

US 2005/0285616 A1  Dec. 29, 2005

(51) Int. Cl.
*G01R 31/26* (2006.01)

(52) U.S. Cl. .................................. 324/522; 324/679
(58) Field of Classification Search .................. 716/4; 702/57, 58; 324/765, 769, 713, 719; 330/288
See application file for complete search history.

(56) References Cited

U.S. PATENT DOCUMENTS

| | | | | | |
|---|---|---|---|---|---|
| 5,426,375 | A | * | 6/1995 | Roy et al. ................ | 324/769 |
| 5,751,179 | A | * | 5/1998 | Pietruszynski et al. ..... | 327/379 |
| 6,161,213 | A | * | 12/2000 | Lofstrom ..................... | 716/4 |
| 6,201,444 | B1 | * | 3/2001 | Sevic et al. ................ | 330/288 |
| 6,724,214 | B1 | * | 4/2004 | Manna et al. ............... | 324/766 |
| 6,815,971 | B1 | * | 11/2004 | Wang et al. ................ | 324/765 |

* cited by examiner

*Primary Examiner*—Vincent Q. Nguyen
(74) *Attorney, Agent, or Firm*—LeMoine Patent Services, PLLC (57) ABSTRACT

A transistor may have degraded characteristics because of an overvoltage condition. The degraded characteristics may be sensed to determine that the transistor has previously been subjected to an overvoltage condition.

18 Claims, 6 Drawing Sheets

OVERVOLTAGE DETECTION APPARATUS, METHOD, AND SYSTEM

FIELD

The present invention relates generally to electronic circuits, and more specifically to integrated circuits that may be subjected to an overvoltage condition.

BACKGROUND

Electronic systems and integrated circuits are typically designed to be operated at a particular power supply voltage or at a power supply voltage within a valid range of power supply voltages. If a larger power supply voltage is applied, systems and circuits may be damaged.

DESCRIPTION OF EMBODIMENTS

In the following detailed description, reference is made to the accompanying drawings that show, by way of illustration, various embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

Figure 1:
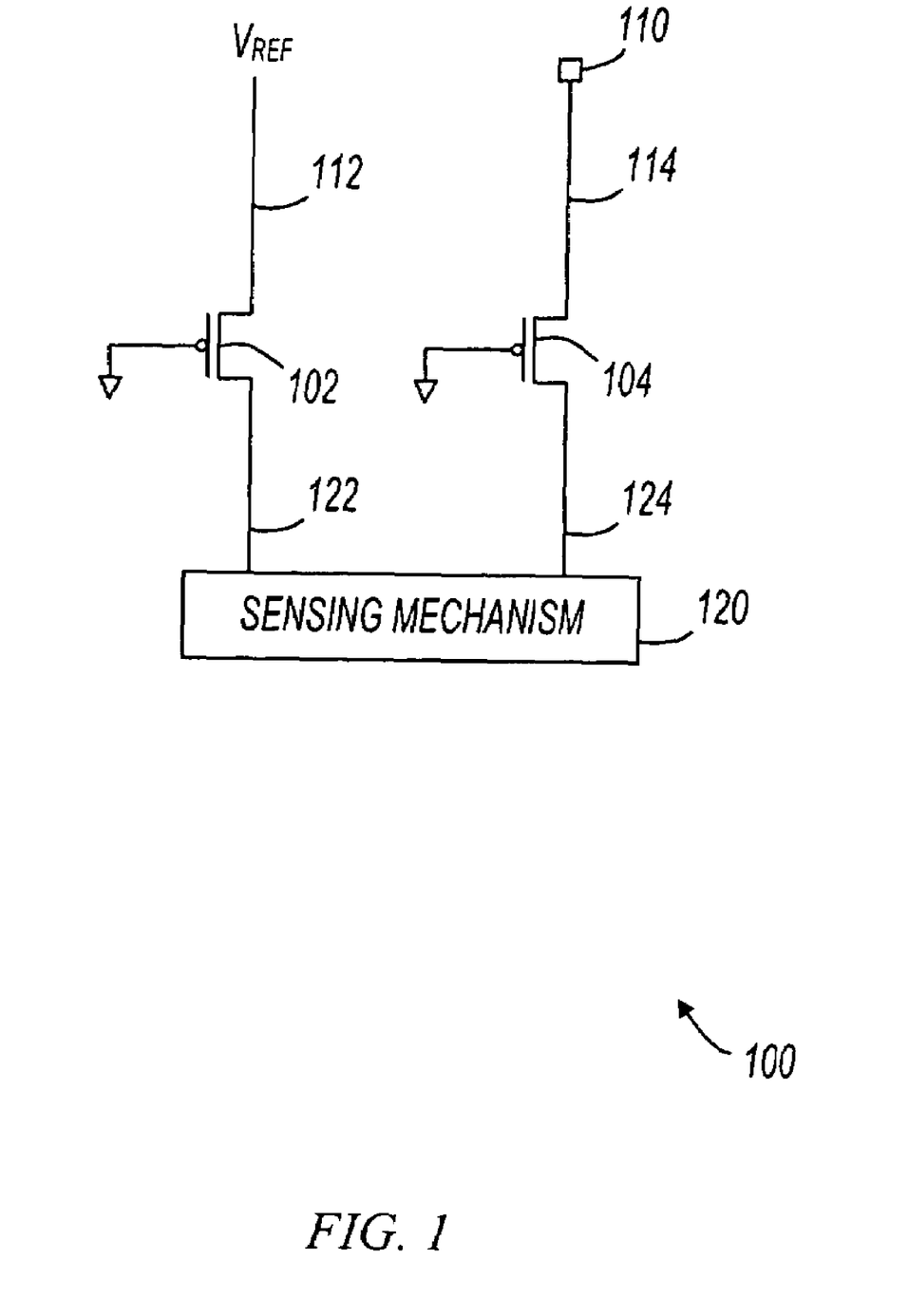
FIG. 1 shows an overvoltage detection circuit.

FIG. 1 shows an overvoltage detection circuit. Circuit 100 includes transistors 102 and 104, and sensing mechanism 120. Transistor 102 is an isolated gate transistor having a gate coupled to a reference node, a source coupled to node 112 and a drain coupled to 122. Node 112 is a reference voltage node that has a reference voltage $V_{REF}$ when circuit 100 is operating, and node 122 is coupled to sensing mechanism 120. Transistor 104 is an isolated gate transistor having a gate coupled to a reference node, a source coupled to node 114 and a drain coupled to node 124. Node 114 is coupled to power supply node 110, and node 124 is coupled to sensing mechanism 120. As used herein, the term "power supply node" refers to a single circuit node, and does not necessarily imply a connection between two nodes or "rails" of a power supply. In some embodiments, circuit 100 is part of an integrated circuit, and power supply node 110 is coupled to a pad or device pin that is external to the integrated circuit. In these embodiments, when a power supply voltage is supplied to the integrated circuit, power supply node 110 is raised to the potential of the power supply voltage.

The integrated circuit within which circuit 100 is included may have an intended power supply voltage value. For example, designers of the integrated circuit may have intended that the integrated circuit only be operated with a "valid" power supply voltage. Also for example, designers of the integrated circuit may have intended that the integrated circuit only be operated with a power supply voltage that lies within a range of valid values. All other power supply voltage values are considered to be invalid. If the integrated circuit is subjected to a power supply voltage value that is above the valid value or above a valid range of values, then the integrated circuit has been subjected to an "overvoltage" condition.

In some embodiments, $V_{REF}$ is generated by a voltage reference circuit on the same integrated circuit die that includes circuit 100. For example, a bandgap voltage reference may be included to generate $V_{REF}$. The present invention is not limited by the manner with which $V_{REF}$ is generated. In some embodiments, $V_{REF}$ may be substantially equal to a valid power supply voltage, such that transistor 102 has a source voltage of a valid power supply voltage. Reference voltage $V_{REF}$ may also be set to an upper value of a range of valid power supply voltages. Transistor 104, on the other hand, has the actual power supply voltage applied to its source node.

Circuit 100 may sense an overvoltage condition by sensing a difference in the operation between transistors 102 and 104. In some embodiments, the difference in operation between transistors 102 and 104 is sensed while the overvoltage condition exists, and in other embodiments, the difference in operation between transistors 102 and 104 is sensed after the overvoltage condition has been removed. In some embodiments, circuit 100 may be able to sense that an overvoltage condition has existed in the past by sensing changes in device characteristics of transistor 104 that result from the overvoltage condition.

An isolated gate transistor conducts a certain amount of current based on its threshold voltage value and the voltage across its various terminals. When a high voltage is applied between the source and drain terminals (and between the source and gate terminals to some extent), the transistor characteristics may degrade. For example, when a source of a transistor sees a high voltage while its gate sees a valid power supply voltage, the transistor is biased in a high impact ionization region and may degrade due to hot carriers ("hot carrier degradation"). Operation in the high impact ionization region produces oxide damage and charge trapping that changes characteristics of the transistor. When a transistor is damaged by charge trapped inside the gate oxide, the transistor threshold voltage may shift, and the transistor may conduct a different amount of current. Also for example, a high voltage on the gate of a transistor may cause transistor degradation through bias temperature instability.

Sensing mechanism 120 may be any suitable circuit to sense the degradation of transistor 104 due to the overvoltage condition. For example, sensing mechanism 120 may detect a current difference between transistors 102 and 104. Also for example, sensing mechanism 120 may detect a voltage difference on nodes 122 and 124. Various embodiments of sensing mechanisms are described more fully below.

Transistors 102 and 104 are shown as isolated gate transistors, and specifically as P-type metal oxide semiconductor field effect transistors (PMOSFETs). Other types of devices subject to characteristic changes due to overvoltage conditions may be utilized for the various transistors of circuit 100 without departing from the scope of the present invention. For example, the transistors of 100 may be N-type metal oxide semiconductor field effect transistors (NMOSFETs) or any other device capable of performing as described herein.

In some embodiments, transistors 102 and 104 are designed to have matching characteristics. For example, in some embodiments, transistors 102 and 104 have relatively large width to length (W/L) ratios to reduce any process-imposed variations and to increase the likelihood that any variations are a result of an overvoltage condition.

As stated previously, circuit 100 may be included in an integrated circuit. The integrated circuit may include any other type of circuit, including but not limited to, microprocessors, digital signal processors, memory devices, amplifiers, or the like. Circuit 100 may also be part of a larger assembly, such as a module that includes multiple integrated circuits, and circuit 100 may detect an overvoltage condition of the entire module. In some embodiments, circuit 100 may be part of an integrated circuit die that includes little else, and the integrated circuit die may be included with any other type of integrated circuit in a module or other assembly.

Detection of overvoltage conditions may have many uses. For example, if an integrated circuit is returned to a manufacturer as a failed part, the manufacturer may easily check to see if the integrated circuit was ever subjected to an overvoltage condition. By comparing characteristics of a reference transistor (transistor 102) and a test transistor (transistor 104), a previous overvoltage condition may be detected.

Figure 2:
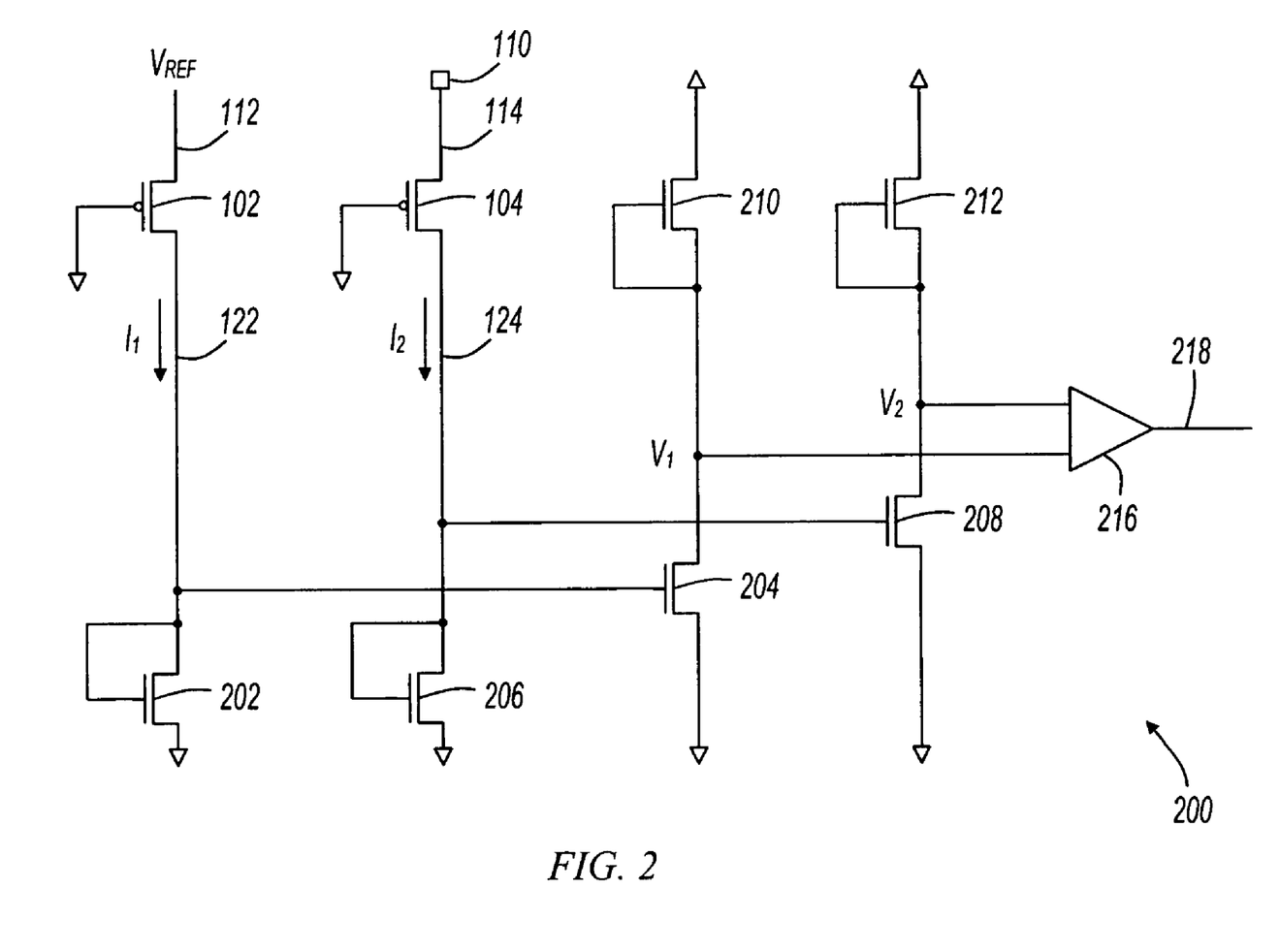
FIG. 2 shows an overvoltage detection circuit with current mirrors.

FIG. 2 shows an overvoltage detection circuit with current mirrors. Circuit 200 includes transistors 102 and 104 and also includes a first current mirror made up of transistors 202 and 204, and a second current mirror made up of transistors 206 and 208. The first current mirror produces a first load current through transistor 210 based on the source-to-drain current ($I_1$) through transistor 102, and the second current mirror produces a second load current through transistor 212 based on the source-to-drain current ($I_2$) through transistor 104. Voltage $V_1$ is produced as a voltage drop across transistor 210, voltage $V_2$ is produced as a voltage drop across transistor 212, and comparator 216 compares $V_1$ and $V_2$.

If during operation of circuit 200, power supply node 110 is subjected to an overvoltage condition, transistor 104 may suffer a change in threshold voltage due to the device operating in an impact ionization region. As a result of the change in threshold voltage, $I_2$ may change in value when the overvoltage condition is present. Further, $I_2$ may have a value different from $I_1$ when the overvoltage condition is no longer present and nodes 112 and 114 have a similar voltage applied. If $I_1$ and $I_2$ have different values, $V_1$ and $V_2$ will have different values, and comparator 216 will toggle a signal on node 218 to indicate that an overvoltage condition has been present at sometime in the past.

The two current mirrors, load transistors 210 and 212, and comparator 216 form a sensing mechanism. For example, in some embodiments, sensing mechanism 120 (FIG. 1) includes the two current mirrors, load transistors 210 and 212, and comparator 216. In some embodiments, the sensing mechanism measures a voltage differential, and in other embodiments, the sensing mechanism measures a current differential.

Circuit 200 may include hysteresis to only report an overvoltage condition in cases where the difference in device characteristics exceeds a threshold. For example, node 218 may only toggle when transistor 104 has been subjected to an overvoltage condition great enough to cause degradation beyond a certain point. The amount of hysteresis, and the particular circuit configuration to achieve the hysteresis, is not a limitation of the present invention. For example, hysteresis may be achieved by an imbalance in currents provided by the current mirrors, differences in load impedances provided by transistors 210 and 212, hysteresis within comparator 216, or any other suitable mechanism.

Comparator 216 may be a digital comparator that causes a signal on node 218 to "toggle," or may be an amplifier that provides an analog signal on node 218 to quantitatively report the difference between transistors 102 and 104. For example, a digital comparator may be used to detect when the overvoltage condition has exceeded a threshold, or an amplifier may be used to describe the actual degree of a previous overvoltage condition. Further, comparator 216 may include an analog-to-digital converter, and node 218 may include multiple physical conductors to report a digital word.

Figure 3:
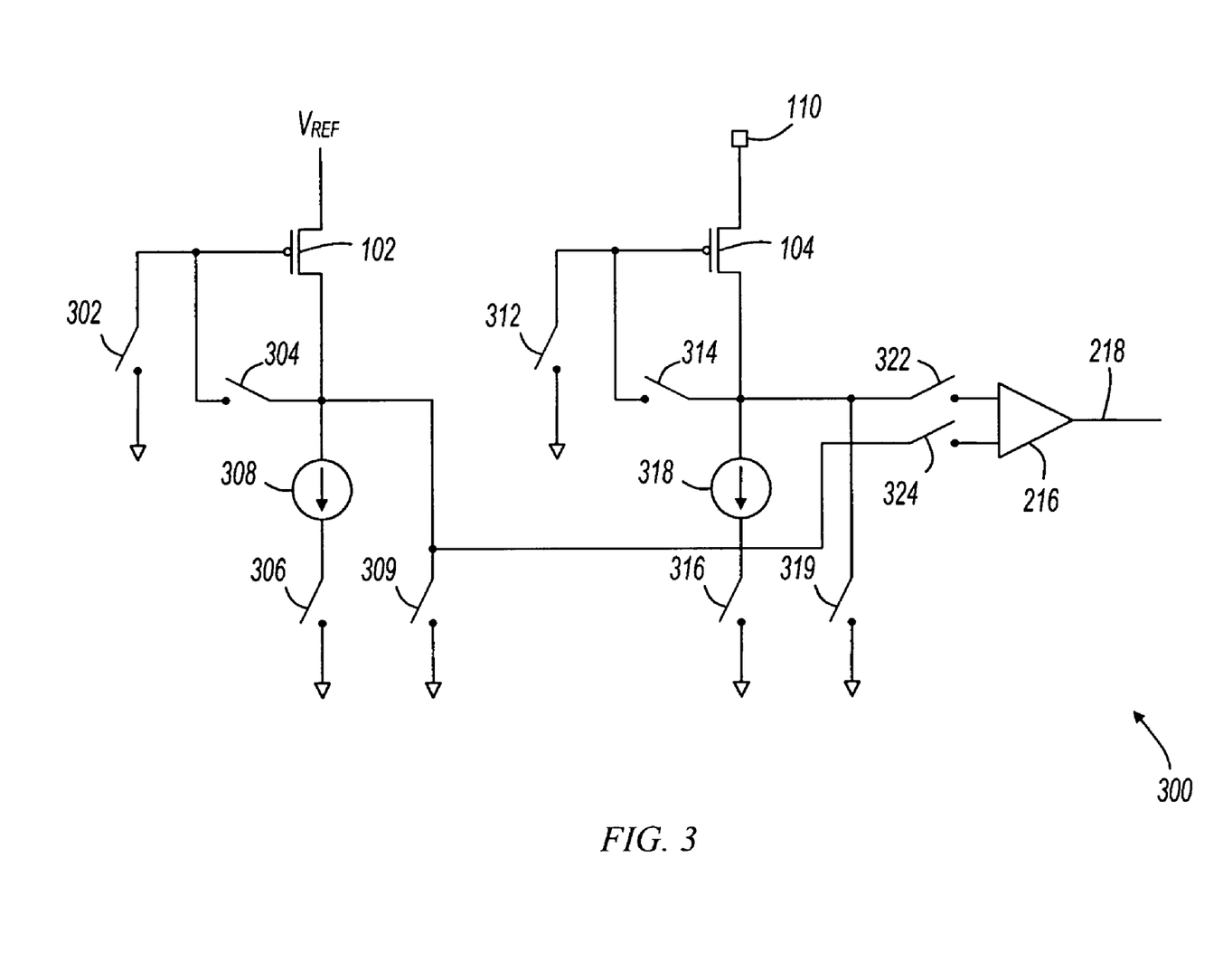
FIG. 3 shows an alternate overvoltage detection circuit.

FIG. 3 shows an alternate overvoltage detection circuit. Circuit 300 includes transistors 102 and 104. As in the previously described embodiments, transistor 102 is coupled to receive a reference voltage $V_{REF}$, and transistor 104 is coupled to a power supply node to receive a power supply voltage. Circuit 300 also includes current sources 308 and 318, switches 302, 304, 306, 309, 312, 314, 316, 319, 322, and 344, and comparator 216.

The switches shown in FIG. 3 may be opened or closed in any combination. In some embodiments, a first subset of switches are closed to subject transistor 104 to the voltage on power supply node 110, and a second subset of switches are closed to sense whether the circuit has ever been subjected to an overvoltage condition.

The switches shown in FIG. 3 may be any type of device capable of coupling the various elements as shown. For example, switches can be implemented with isolated gate transistors such as metal oxide semiconductor field effect transistors (MOSFETs). Other types of switching elements may also be utilized for the various switches without departing from the scope of the present invention. For example, the switches may be implemented using junction field effect transistors (JFETs), bipolar junction transistors (BJTs), or any device capable of performing as described herein. Also for example, some of the switches may be implemented with diodes or other elements that allow current to flow in only one direction.

Figure 4:
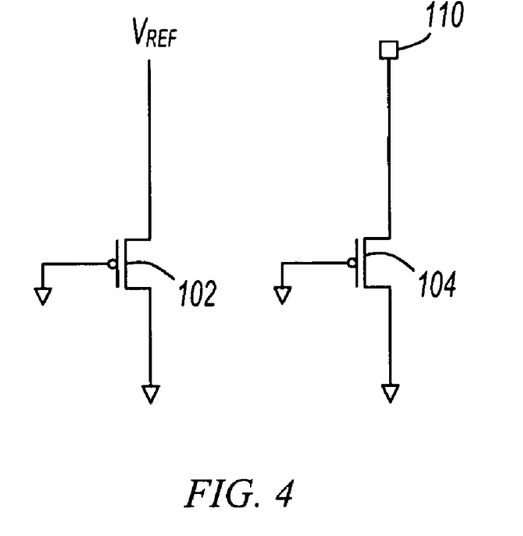
FIGS. 4 and 5 show various configurations of the circuit of FIG. 3.
Figure 5:
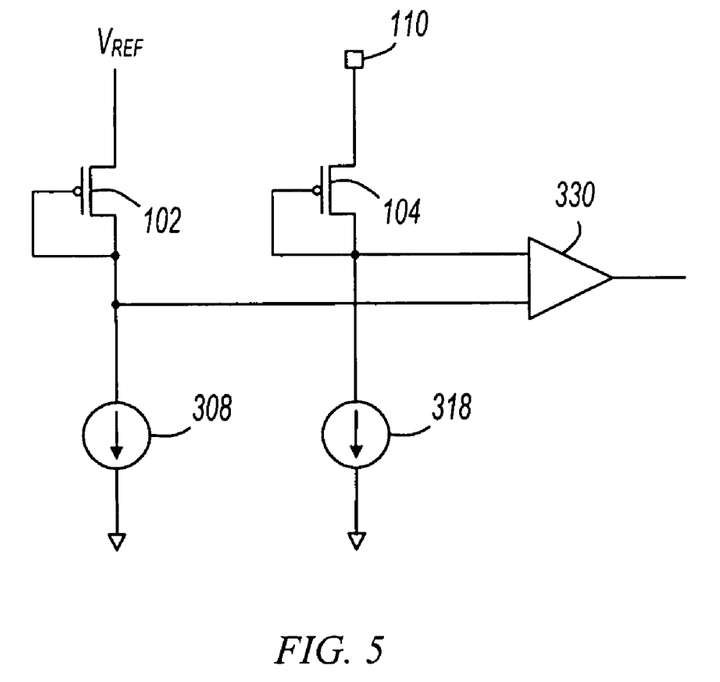

FIGS. 4 and 5 show various configurations of the circuit of FIG. 3. FIG. 4 shows the equivalent circuit of FIG. 3 when switches 302, 309, 312, and 319 are closed, and the remaining switches are open. In this configuration, transistor 102 is coupled to $V_{REF}$, and transistor 104 is coupled to power supply node 110. FIG. 5 shows the equivalent circuit of FIG. 3 when switches 304, 306, 314, 316, 322, and 324 are closed, and the remaining switches are open. In this configuration, current sources 308 and 318 develop voltages across transistors 102 and 104. If transistor 104 has been subjected to an overvoltage condition, then the voltage drop across transistor 104 will be different than the voltage drop across transistor 102, and comparator 216 may detect the previous overvoltage condition.

The overvoltage detection circuit may be switched over from the configuration of FIG. 4 to the configuration of FIG. 5 to detect a prior overvoltage condition. The switch-over may be controlled by circuits co-located with the overvoltage detection circuit. For example, the overvoltage detection circuit may be included on an integrated circuit die that also includes a microprocessor, and the microprocessor may control the various switches. The switch-over may also be controlled by a circuit that is not co-located with the overvoltage detection circuit. For example, an integrated circuit tester may send control signals to an integrated circuit that includes the overvoltage detection circuit, and the overvoltage detection circuit may report whether a prior overvoltage condition has been detected.

Figure 6:
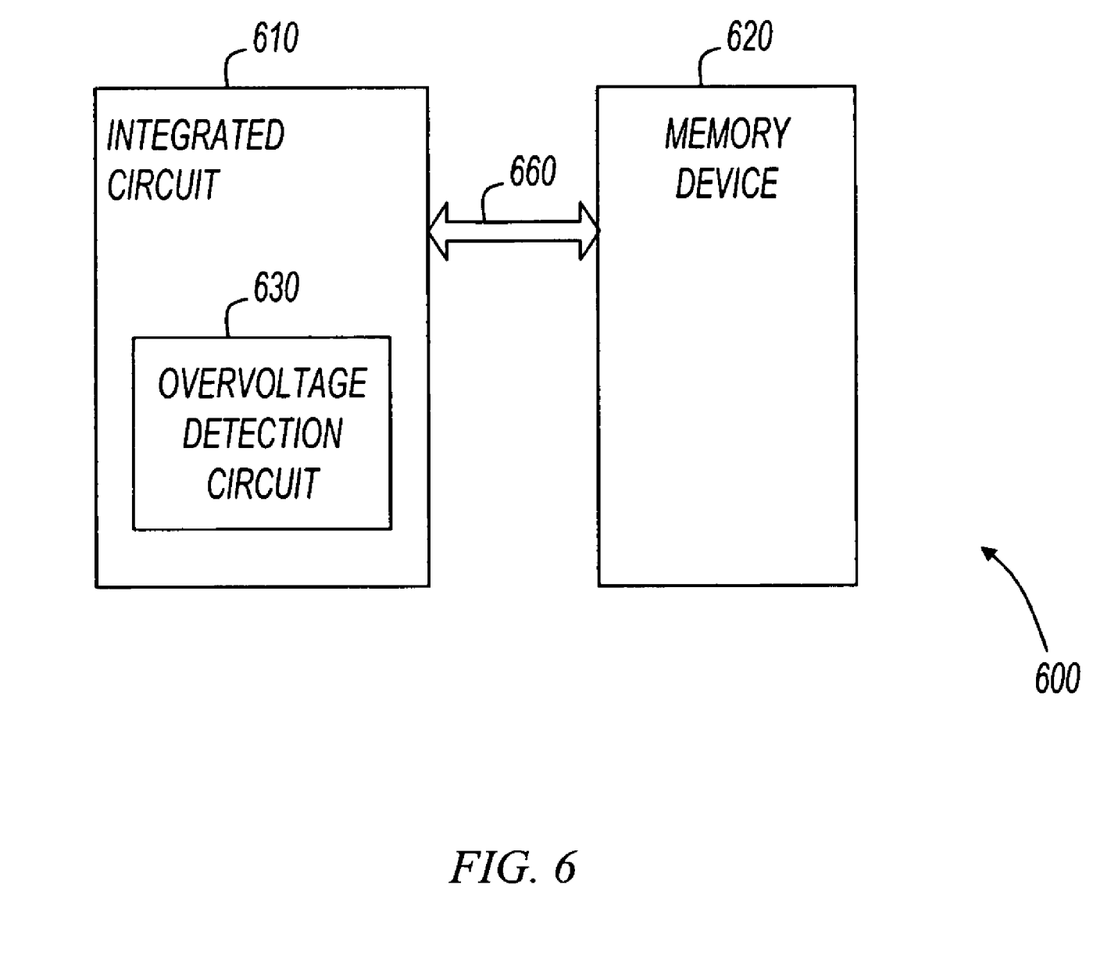
FIG. 6 shows a system diagram in accordance with various embodiments of the present invention.

FIG. 6 shows a system diagram in accordance with various embodiments of the present invention. Electronic system 600 includes integrated circuit 610 and memory device 620 interconnected by conductor 660. Integrated circuit 610 includes overvoltage detection circuit 630. Integrated circuit 610 may be any type of integrated circuit adapted to communicate with memory device 620. For example, integrated circuit 610 may be a microprocessor, a digital signal processor, a microcontroller, an application specific integrated circuit (ASIC), a memory controller, or the like. In some embodiments, memory device 620 may include a dynamic random access memory (DRAM), a static random access memory (SRAM), a FLASH memory or any other type of memory capable of storing information.

Overvoltage detection circuit 630 may be any of the embodiments disclosed herein. For example, overvoltage detection circuit 630 may include a first transistor coupled to a reference node, a second transistor coupled to a power supply node, and a sensing mechanism coupled to the two transistors. The sensing mechanism may include current sources, switches, current mirrors, comparators, or any other useful circuits.

In some embodiments, integrated circuit 610 and memory device 620 may be separately packaged and mounted on a common circuit board. Each of integrated circuit 610 and memory device 620 may also be separately packaged and mounted on separate circuit boards interconnected by conductor 660. In other embodiments, integrated circuit 610 and memory device 620 are separate integrated circuit dice packaged together, such as in a multi-chip module, and in still further embodiments, integrated circuit 610 and memory device 620 are on the same integrated circuit die.

The type of interconnection between integrated circuit 610 and memory device 620 is not a limitation of the present invention. For example, conductor 660 may be a serial interface, a test interface, a parallel interface, or any other type of interface capable of transferring information between integrated circuit 610 and memory device 620.

Integrated circuits, overvoltage detection circuits, sensing mechanisms, and other embodiments of the present invention can be implemented in many ways. In some embodiments, they are implemented in integrated circuits. In some embodiments, design descriptions of the various embodiments of the present invention are included in libraries that enable designers to include them in custom or semi-custom designs. For example, any of the disclosed embodiments can be implemented in a synthesizable hardware design language, such as VHDL or Verilog, and distributed to designers for inclusion in standard cell designs, gate arrays, or the like. Likewise, any embodiment of the present invention can also be represented as a hard macro targeted to a specific manufacturing process. For example, overvoltage detection circuit 200 (FIG. 2) may be represented as polygons assigned to layers of an integrated circuit.

Figure 7:
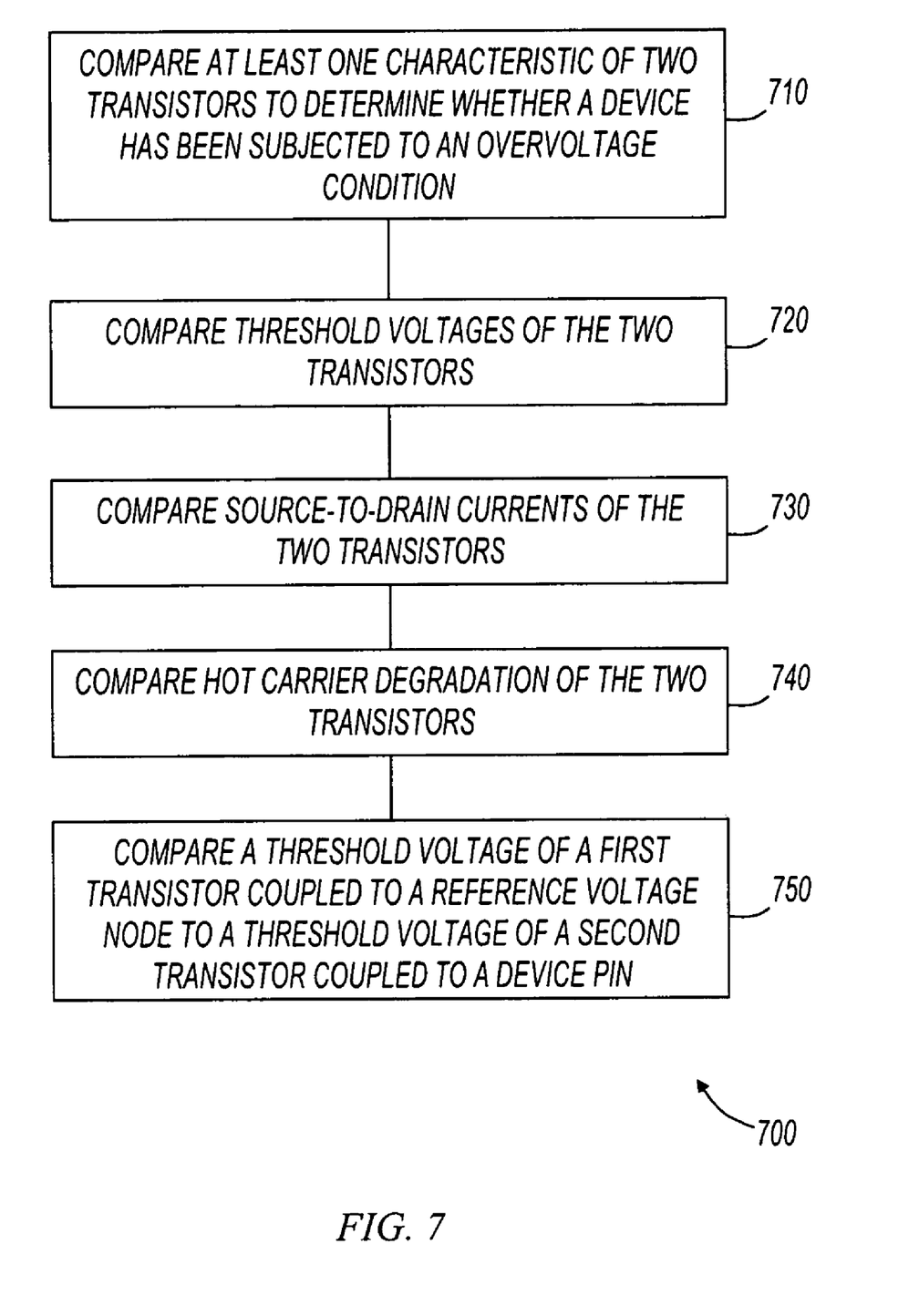
FIG. 7 shows a flowchart in accordance with various embodiments of the present invention.

FIG. 7 shows a flowchart in accordance with various embodiments of the present invention. In some embodiments, method 700, or portions thereof, is performed by an overvoltage detection circuit, embodiments of which are shown in previous figures. In other embodiments, method 700 is performed by a control circuit, an integrated circuit, or an electronic system. Method 700 is not limited by the particular type of apparatus performing the method. The various actions in method 700 may be performed in the order presented, or may be performed in a different order. Further, in some embodiments, some actions listed in FIG. 7 are omitted from method 700.

Method 700 is shown beginning with block 710 in which at least one characteristic of two transistors is compared to determine whether a device has been subjected to an overvoltage condition. In some embodiments, this corresponds to the operation of an overvoltage detection circuit in an integrated circuit. For example, the actions of block 710 may be utilized to compare a characteristic of two transistors within overvoltage detection circuit 630 (FIG. 6) to determine if integrated circuit 610 (FIG. 6) has been subjected to an overvoltage condition.

The remaining blocks listed in method 700 outline various characteristics that may be compared. In some embodiments, all listed characteristics are compared, and in other embodiments, one or more characteristics are compared. Accordingly, not all of the remaining blocks in method 700 are necessarily visited each time method 700 is performed.

At 720, threshold voltages of the two transistors are compared. Threshold voltages may be compared directly or indirectly. A direct comparison may include circuitry to measure when the transistors turn on, and an indirect comparison may include comparison of currents or voltages that are a function of the threshold voltages. At 730, source-to-drain currents of the two transistors are compared. For example, referring now to FIG. 2, currents $I_1$ and $I_2$ may be compared by the sensing mechanism that includes current mirrors and a comparator.

At 740, hot carrier degradation of two transistors is compared. In some embodiments, one transistor has undergone hot carrier degradation as a result of being subjected to an overvoltage condition, and the other transistor is configured as a reference transistor that does not undergo hot carrier degradation. For example, in the previous figures, transistor 104 is configured to undergo hot carrier degradation in the presence of an overvoltage condition, and transistor 102 is configured as a reference transistor that will not undergo hot carrier degradation.

At 750, a threshold voltage of a first transistor is compared to a threshold voltage of a second transistor where the first transistor is coupled to a reference voltage node and the second transistor is coupled to a device pin. In some embodiments, the first transistor of 750 corresponds to transistor 102 (FIGS. 1–5) and the second transistor corresponds to transistor 104 (FIGS. 1–5). The device pin referred to in 750 may correspond to a pin of a packaged integrated circuit or a pad of an integrated circuit die that receives a power supply voltage for the device such that the second transistor may be subjected to an overvoltage condition when a power supply voltage with too large a potential is applied to the device.

Although the present invention has been described in conjunction with certain embodiments, it is to be understood that modifications and variations may be resorted to without departing from the spirit and scope of the invention as those skilled in the art readily understand. Such modifications and variations are considered to be within the scope of the invention and the appended claims.

What is claimed is:

1. An integrated circuit comprising:
   a power supply node;
   a transistor coupled to the power supply node to undergo hot carrier degradation if the power supply node is subjected to an overvoltage condition; and
   a sensing mechanism to sense the hot carrier degradation wherein the sensing mechanism includes a current source conditionally coupled to the transistor to sense the hot carrier degradation.

2. The integrated circuit of claim 1 further comprising a comparator to compare a voltage on a node between the transistor and the current source with a second voltage.

3. The integrated circuit of claim 1 further comprising a second transistor to not undergo hot carrier degradation if the power supply node is subjected to an overvoltage condition.

4. The integrated circuit of claim 3 wherein the sensing mechanism is coupled to the transistor and the second transistor to compare currents through the transistor and the second transistor.

5. The integrated circuit of claim 1 wherein the transistor is a p-type metal oxide semiconductor field effect transistor.

6. The integrated circuit of claim 1 wherein the transistor is an n-type metal oxide semiconductor field effect transistor.

7. An integrated circuit comprising:
   a power supply node;
   a transistor coupled to the power supply node to undergo hot carrier degradation if the power supply node is subjected to an overvoltage condition;
   a second transistor to not undergo hot carrier degradation if the power supply node is subjected to an overvoltage condition; and
   a sensing mechanism to sense the hot carrier degradation, wherein the sensing mechanism includes:
      a first current source coupled to the transistor at a first node;
      a second current source coupled to the second transistor at a second node; and
      a comparator to compare voltages at the first and second nodes.

8. An integrated circuit comprising:
   a power supply node;
   a first isolated gate transistor having a drain coupled to the power supply node, and having a gate and source coupled to cause hot carrier degradation of the first isolated gate transistor when the power supply node is subjected to an overvoltage condition; and
   a sensing mechanism to sense the hot carrier degradation of the first isolated gate transistor, wherein the sensing mechanism includes at least one current mirror and a comparator.

9. An integrated circuit comprising:
   a power supply node;
   a first isolated gate transistor having a drain coupled to the power supply node, and having a gate and source coupled to cause hot carrier degradation of the first isolated gate transistor when the power supply node is subjected to an overvoltage condition;
   a sensing mechanism to sense the hot carrier degradation of the first isolated gate transistor; and
   a second isolated gate transistor coupled to the sensing mechanism, wherein the second isolated gate transistor includes a drain coupled to a reference voltage node, and a gate and source coupled to not cause hot carrier degradation of the second isolated gate transistor when the power supply node is subjected to the overvoltage condition.

10. The integrated circuit of claim 9 wherein the sensing mechanism is coupled to measure a difference between threshold voltages of the first and second isolated gate transistors.

11. The integrated circuit of claim 9 wherein the sensing mechanism is coupled to sense a current difference between the first and second isolated gate transistors.

12. The integrated circuit of claim 9 wherein the first isolated gate transistor is a p-type metal oxide semiconductor field effect transistor.

13. The integrated circuit of claim 9 wherein the first isolated gate transistor is an n-type metal oxide semiconductor field effect transistor.

14. An integrated circuit comprising a first transistor having a drain coupled to a power supply node, wherein the first transistor is coupled to undergo hot carrier degradation when the power supply node is subjected to an overvoltage condition, a second transistor coupled to not undergo hot carrier degradation when the power supply node is subjected to the overvoltage condition, and a sensing mechanism to sense a difference between the first and second transistors, wherein the sensing mechanism includes at least one current mirror and a comparator.

15. The integrated circuit of claim 14 wherein the sensing mechanism is coupled to measure a difference between threshold voltages of the first and second transistors.

16. The integrated circuit of claim 14 wherein the sensing mechanism is coupled to sense a current difference between the first and second transistors.

17. The integrated circuit of claim 14 wherein the first transistor is a p-type metal oxide semiconductor field effect transistor.

18. The integrated circuit of claim 14 wherein the first transistor is an n-type metal oxide semiconductor field effect transistor.

* * * * *